United States Patent
Park

(10) Patent No.: US 9,343,634 B2
(45) Date of Patent: May 17, 2016

(54) LIGHT EMITTING DEVICE

(75) Inventor: Dong Wook Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 1366 days.

(21) Appl. No.: 12/328,431

(22) Filed: Dec. 4, 2008

(65) Prior Publication Data

US 2009/0147498 A1    Jun. 11, 2009

(30) Foreign Application Priority Data

Dec. 6, 2007    (KR) .................. 10-2007-0126195

(51) Int. Cl.
| | |
|---|---|
| H01L 25/00 | (2006.01) |
| H01L 33/48 | (2010.01) |
| H01L 33/60 | (2010.01) |
| H01L 25/075 | (2006.01) |

(52) U.S. Cl.
CPC .............. *H01L 33/486* (2013.01); *H01L 33/60* (2013.01); *H01L 25/0753* (2013.01); *H01L 2224/48091* (2013.01); *H01L 2224/48227* (2013.01)

(58) Field of Classification Search
USPC .................. 362/84, 237, 249.02; 257/100
See application file for complete search history.

(56) References Cited

U.S. PATENT DOCUMENTS

| | | | |
|---|---|---|---|
| 6,345,903 B1 * | 2/2002 | Koike et al. ............ | 362/241 |
| 6,429,464 B1 * | 8/2002 | Lin ........................ | 257/99 |
| 6,502,968 B1 * | 1/2003 | Simon .................... | 362/489 |
| 7,453,093 B2 * | 11/2008 | Kim et al. ............... | 257/79 |
| 7,989,829 B2 * | 8/2011 | Yang et al. .............. | 257/98 |
| 2006/0169991 A1 | 8/2006 | Kikuchi | |
| 2007/0145398 A1 | 6/2007 | Shin | |

FOREIGN PATENT DOCUMENTS

| | | |
|---|---|---|
| JP | 2005-116846 A | 4/2005 |
| JP | 2006-216623 A | 8/2006 |
| JP | 2007-194519 A | 8/2007 |
| JP | 2008-131012 A | 6/2008 |
| KR | 10-2007-0067450 A | 6/2007 |
| KR | 10-2007-0075253 A | 7/2007 |
| KR | 10-0755086 B1 | 9/2007 |

* cited by examiner

*Primary Examiner* — Sharon Payne
(74) *Attorney, Agent, or Firm* — Birch, Stewart, Kolasch & Birch, LLP

(57) ABSTRACT

Disclosed are a light emitting device. The light emitting device comprises a board comprising a plurality of lead frames, a light emitting diode chip electrically connected to the lead frames, and a reflective member formed coupled on the board while surrounding the light emitting diode.

10 Claims, 6 Drawing Sheets

LIGHT EMITTING DEVICE

The present application claims priority under 35 U.S.C. 365 to Korean Patent Application No. 10-2007-00126195 (filed on Dec. 6, 2007), which is hereby incorporated by reference in its entirety.

BACKGROUND

A light emitting diode (LED) constitutes a light emitting source by using a compound semiconductor material, such as a GaAs-based compound semiconductor material, AlGaAs-based compound semiconductor material, a GaN-based compound semiconductor material, an InGaN-based compound semiconductor material or an InGaAlP-based compound semiconductor material.

The light emitting diode is packaged and used as a light emitting device for emitting light having various colors. Such a light emitting diode is used as a light source in various fields, such as a lightening indicator for displaying colors, a character indicator, and an image indicator.

SUMMARY

The embodiment provides a light emitting device comprising an LED chip formed on a board and a reflective member provided around the LED chip.

The embodiment provides a light emitting device comprising a box-type reflective member provided around an LED chip formed on a board.

An embodiment provides a light emitting device comprising: a board comprising a plurality of lead frames, a light emitting diode (LED) chip electrically connected to the lead frames, and a reflective member coupled on the board while surrounding the light emitting diode.

An embodiment provides a light emitting device comprising: a board comprising a lead frame, a box-shape reflective member coupled on the board and comprising open upper and lower potions, and an LED chip electrically connected to the lead frame in the reflective member.

An embodiment provides a light emitting device comprising: a board comprising a plurality of lead frames; a reflective member comprising a sidewall frame and a base frame extend from the sidewall on the board; and a light emitting diode (LED) in the reflective member.

DETAILED DESCRIPTION OF THE EMBODIMENTS

Hereinafter, a light emitting device according to the embodiment will be described with reference to accompanying drawings.

Figure 1:
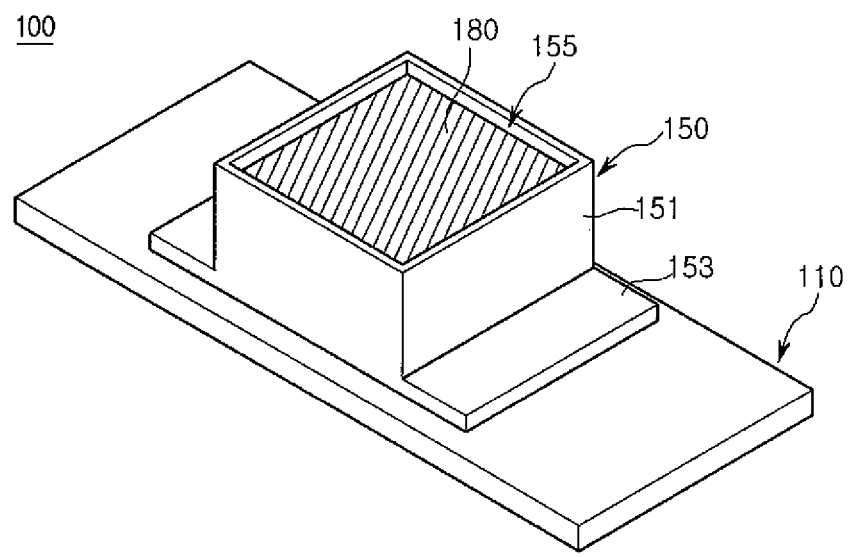
FIG. 1 is a perspective view showing a light emitting device according to a first embodiment.
Figure 2:
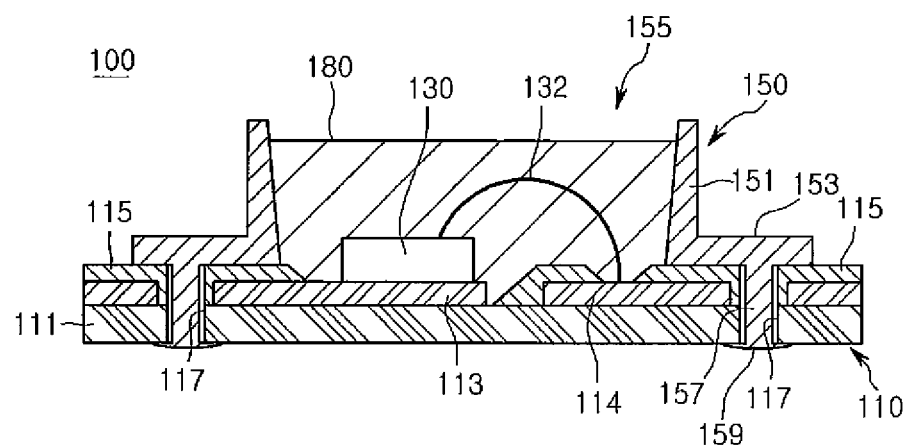
FIG. 2 is a side sectional view of FIG. 1.
Figure 3:
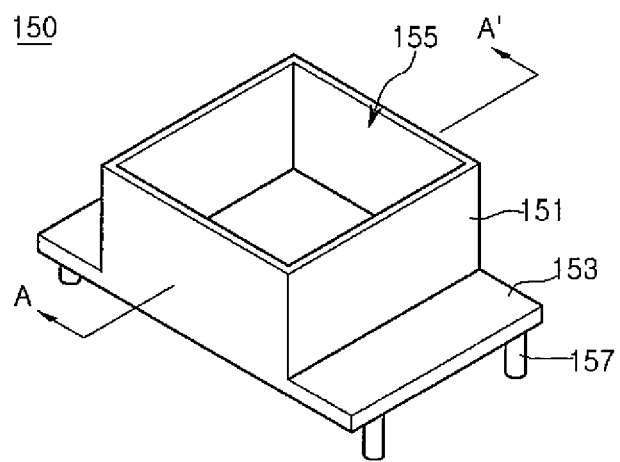
FIG. 3 is a perspective view showing a reflective member illustrated in FIG. 1.
Figure 4:
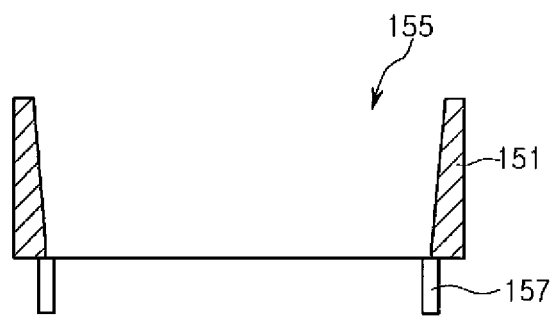
FIG. 4 is a sectional view taken along line A-A' of FIG. 3.

FIG. 1 is a perspective view showing a light emitting device according to a first embodiment, FIG. 2 is a side sectional view of FIG. 1, FIG. 3 is a perspective view showing a reflective member illustrated in FIG. 1, and FIG. 4 is a sectional view taken along line A-A' of FIG. 3.

Referring to FIGS. 1 and 2, the light emitting device 100 comprises a board 110, an LED chip 130, a reflective member 150 and a resin material 180.

The board 110 comprises one of a metal PCB (printed circuit board), a flexible PCB, a CEM (Contract Electronics Manufacturing) PCB, and an FR (Flame retardant) PCB. The board 110 may comprise a heat slug type PCB, in which a chip mounting region is made from a metallic material, by taking the heat dissipation characteristic into consideration. The board 110 may have a single layer structure or a multi-layer structure, and the embodiment is not limited thereto.

A plurality of lead frames 113 and 114 are formed on the board 110 such that the lead frames 113 and 114 can be electrically open. Insulating ink 115 can be coated on the board 110, except for a bonding region of the lead frames 113 and 114 and a chip mounting region. The insulating ink 115 may comprise PSR (photo solder resist) ink, which can improve the reflective efficiency.

The LED chip 130 is attached to the first lead frame 113. The LED chip 130 comprises at least one of a color LED chip, such as a red LED chip, a blue LED chip or a green LED chip, and a UV (Ultra-Violet) LED chip. In addition, a plurality of LED chips can be combined in use within the technical scope of the embodiment.

The LED chip 130 is attached to the first lead frame 113 by a conductive adhesive, and electrically connected to the second lead frame 114 through a wire 132. The LED chip 130 can be electrically connected to the lead frames 113 and 114 through a plurality of wires or a flip chip scheme. However, the embodiment is not limited thereto.

At least one fixing hole 117 can be formed in an outer peripheral portion of the board 110. If plural fixing holes 117 are provided, the fixing holes 117 are formed at both sides of the board 110 and the embodiment is not limited thereto. The fixing hole 117 has a via structure in the board 110.

The reflective member 150 has a container shape or a box shape having open upper and lower portions. For instance, the reflective member 150 may have a cylindrical shape or a polyhedral shape. The reflective member 150 is inclined such that the size of a lower portion of the reflective member 150 is smaller than the size of an upper portion of the reflective member 150.

The reflective member 150 is provided around the LED chip 130 on the board 110 and serves as a reflective cup.

Referring to FIGS. 2 to 4, the reflective member 150 comprises a sidewall frame 151 and a base frame 153 and is made from a reflective material. For instance, the reflective member 150 is fabricated through an injection molding process by using a resin material, such as PPA (Polyphthalamide) and the like.

The sidewall frame 151 has a container shape or a box shape and a hole 155 is formed in the sidewall frame 151. The hole 155 has a circular shape or a polygonal shape. The hole 155 has a shape identical to or different from a shape of the sidewall frame 151.

The sidewall frame 151 is inclined outward by a predetermined angle about an axis perpendicular to the base frame 153 and protrudes upward from the base frame 153 by a predetermined height.

The base frame 153 horizontally extends outward from a lower end of the sidewall frame 151 in parallel to the board 110. The base frame 153 can be formed at left and right sidewalls of the sidewall frame 151. However, the embodiment is not limited thereto.

The reflective member 150 has a size smaller than or identical to a size of the board 110.

The base frame 153 is provided at a lower portion thereof with at least one fixing pin 157. The fixing pin 157 protrudes in the form of a leg. The number and the position of the fixing pin 157 correspond to the number and position of the fixing hole 117 formed in the board 110.

Although the reflective member 150 has been described in that the reflective member 150 comprises the base frame 153 and the sidewall frame 151, the shape, the size and the structure of the reflective member 150 can be modified within the technical scope of the embodiment.

Referring to FIGS. 1 and 2, the base frame 153 makes surface-contact with an upper surface of the board 110 or is fixed thereto by an adhesive, a screw, a hook or an adhesion as well as a pin. The fixing pin 157 of the base frame 153 is inserted into the fixing hole 117 of the board 110. An end portion 159 of the fixing pin 157 is thermally compressed through a thermal pressing process, so that the fixing pin 157 is prevented from being separated from the fixing hole 117.

The fixing pin 157 of the base frame 153 and the fixing hole 117 of the board 110 may have circular shapes or polygonal shapes. However, the embodiment is not limited thereto. In addition, the reflective member 150 can be coupled to the board 110 by using a screw, a hook, an adhesive or an adhesion as well as a pin.

The resin material 180 is formed in the reflective member 150. The resin material 180 comprises a light transmitting material, such as silicon or epoxy. A fluorescent substance (not shown), which can be mixed with a color of the LED chip 130, can be added to the resin material 180.

FIGS. 5 to 9 are sectional views showing the manufacturing procedure for the light emitting device according to a first embodiment.

Figure 5:
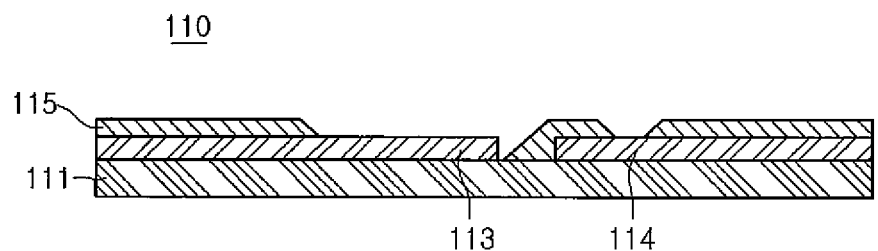
FIGS. 5 to 9 are sectional views showing the manufacturing procedure for a light emitting device according to a first embodiment.

Referring to FIG. 5, a plurality of lead frames 113 and 114, which are electrically open, are formed on the board 110 in a predetermined pattern. The board 110 comprises one of a metal PCB, a flexible PCB, a CEM PCB, an FR PCB, and a heat slug type PCB. Insulating ink 115, such as PSR ink, can be coated on the board 110 by a predetermined thickness, except for a bonding region of the lead frames 113 and 114 and a chip mounting region.

The lead frames 113 and 114 are exposed to the insulating ink 115.

Figure 6:
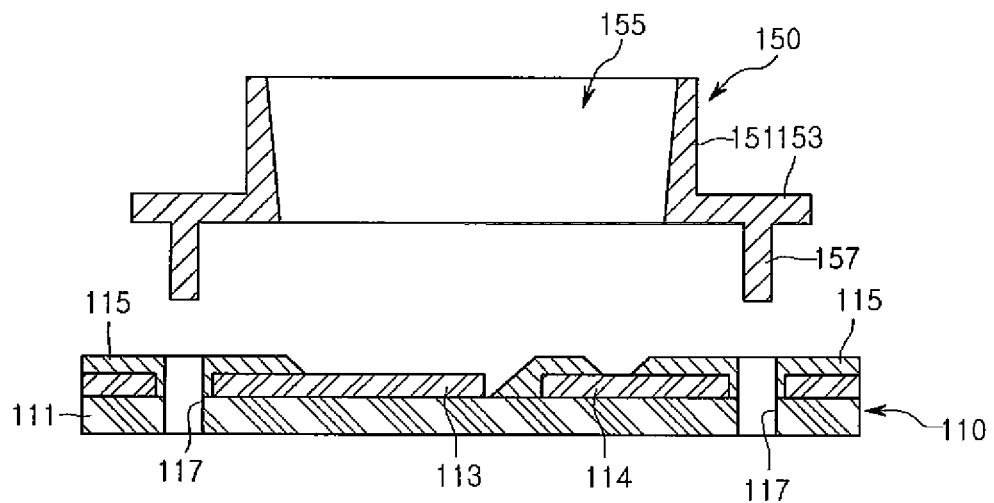

Referring to FIG. 6, the fixing holes 117 are formed at outer portions of the board 110. The lead frames 113 and 114 may have openings for the fixing holes 117. The openings can prevent short or current leakage from occurring in the fixing holes 117 when forming the fixing holes 117.

Figure 7:
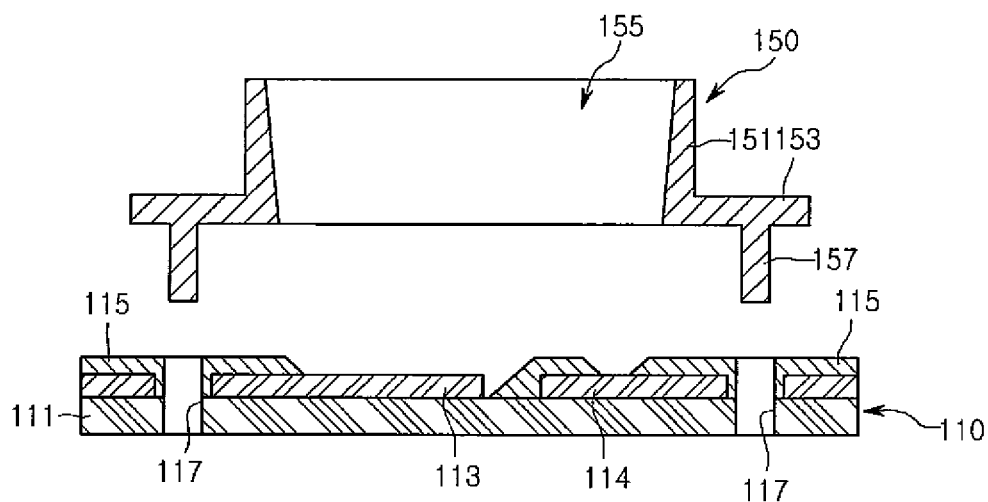

Referring to FIG. 7, the reflective member 150 is formed on the board 110 in such a manner that the fixing pin 157 of the reflective member 150 corresponds to the fixing hole 117 of the board 110. The fixing pin 157 of the reflective member 150 and the fixing hole 117 of the board 110 may have shapes corresponding to each other. For instance, the fixing pin 157 of the reflective member 150 and the fixing hole 117 of the board 110 may have circular shapes or polygonal shapes.

Figure 8:
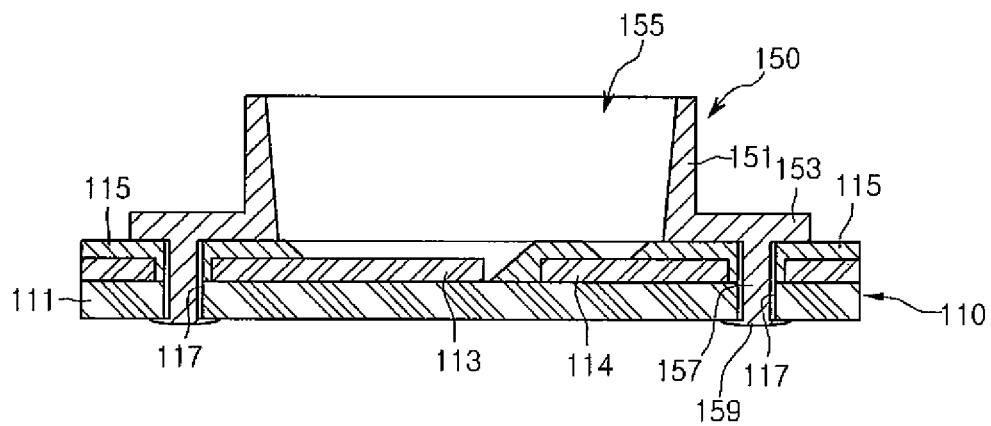

Referring to FIG. 8, when the reflective member 150 is coupled to the board 110, the base frame 153 of the reflective member 150 makes surface-contact with the upper surface of the board 110. The reflective member 150 is secured to the board 110 by applying an adhesive or an adhesion between the base frame 153 of the reflective member 150 and the board 110.

The fixing pin 157 of the reflective member 150 is inserted into the fixing hole 117 of the board 110. The end portion 159 of the fixing pin 157 protrudes downward out of the board 110 and is thermally compressed by applying heat to the end portion 159 of the fixing pin 157. Thus, the fixing pin 157 can be prevented from being separated from the fixing hole 117 by the end portion 159 of the fixing pin 157.

Figure 9:
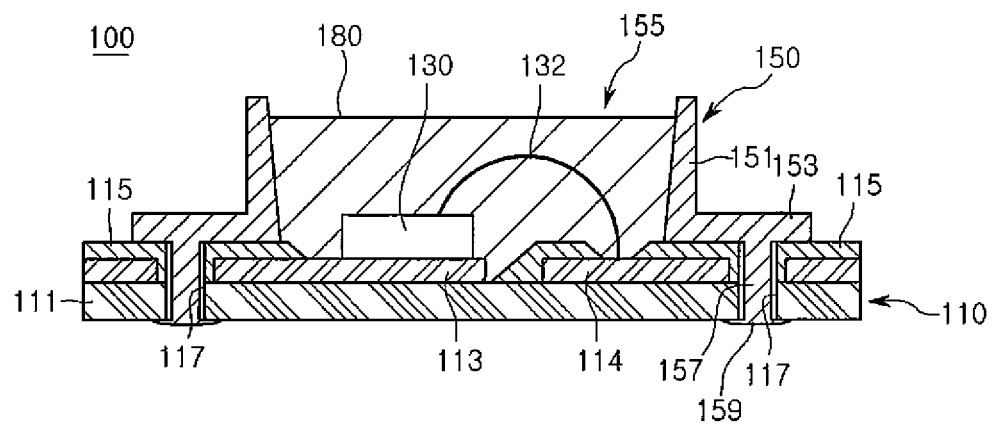

Referring to FIG. 9, the LED chip 130 is mounted on the board 110 after the reflective member 150 has been coupled to the board 110.

The LED chip 130 is attached to the first lead frame 113 in the reflective member 150 and electrically connected to the second lead frame 114 through the wire 132. The LED chip 130 can be electrically connected to the lead frame 113 by a conductive adhesive. In addition, the LED chip 130 can be electrically connected on the lead frames 113 and 114 through wires or a flip chip scheme. However, the embodiment is not limited thereto.

The LED chip 130 comprises at least one of a color LED chip, such as a red LED chip, a blue LED chip or a green LED chip, and a UV LED chip. In addition, a plurality of LED chips can be combined in use within the technical scope of the embodiment.

The resin material 180 is filled in the hole 155 of the reflective member 150. The resin material 180 comprises silicon or epoxy. A fluorescent substance can be added to the resin material 180.

The LED chip 130 can be mounted on the on the board 110 after or before the reflective member 150 has been coupled to the board 110. The surface of the resin material 180 has a flat shape, a concave lens shape or a convex lens shape. However, the embodiment is not limited thereto.

Figure 10:
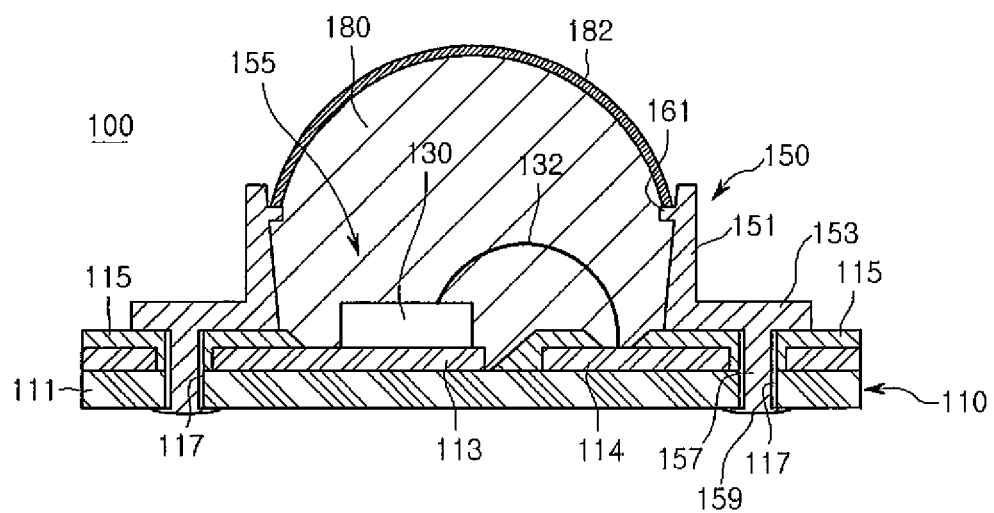
FIG. 10 is a section view showing a light emitting device according to a second embodiment.

FIG. 10 is a section view showing a light emitting device according to a second embodiment. In the description of the second embodiment, elements that have been described in the first embodiment will not be further described in order to avoid redundancy.

Referring to FIG. 10, the light emitting device 100 comprises a lens 182 provided on the resin material 180.

A stopper 161 is formed at an inner upper portion of the sidewall frame 151 of the reflective member 150. The stopper 161 protrudes from the inner peripheral surface of the sidewall frame 151.

The resin material 180 is formed in the reflective member 150 and has a convex upper portion. The lens 182 is formed on the convex upper portion of the resin material 180 and the stopper 161 supports a lower peripheral portion of the lens 182.

Figure 11:
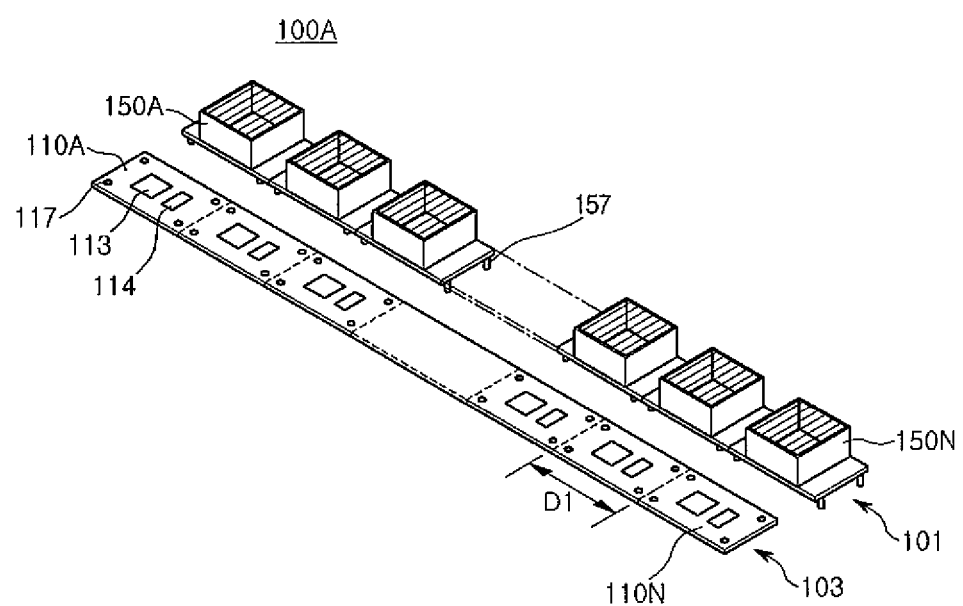
FIG. 11 is a perspective view showing a light emitting device array according to a third embodiment.

FIG. 11 is a perspective view showing a light emitting device array according to a third embodiment. In the description of the third embodiment, elements that have been described in the first embodiment will not be further described in order to avoid redundancy.

Referring to FIG. 11, the light emitting device array 100A comprises a reflective member assembly 101 having a plurality of reflective members 150A to 150N prepared in the form of an array, and an array board 103 disposed below the reflective member assembly 101.

The reflective members 150A to 150N are fabricated through an injection molding process such that the reflective members 150A to 150N are spaced apart from each other by a predetermined distance (D1). A hole is formed in each reflective member and a fixing pin 157 protrudes downward from a bottom surface of the reflective member assembly 101.

The array board 103 has board regions 110A to 110N, which are spaced part from each other by a predetermined distance (D1). The board regions 110A to 110N correspond to the reflective members 150A to 150N of the reflective member assembly 101, respectively. The lead frames 113 and 114 and the fixing holes 117 are formed in the board regions 110A to 110N of the array board 103.

At least on LED chip (not shown) can be mounted on the lead frames 113 and 114. The embodiment does not limit the number and the type of the LED chips.

The LED chip can be mounted on the on the array board 103 after or before the reflective member assembly 101 has been coupled to the array board 113.

The light emitting device array may be cut into at least one the reflective members unit for using as a light emitting device.

The light emitting device according to the embodiment comprises the board assembled with the reflective member so that the light emitting device can be simply fabricated. In addition, since various types of boards can be applied to the light emitting device of the embodiment, the board having superior heat dissipation characteristic can be adopted in the embodiment. In addition, the light emitting device can improve the heat dissipation characteristics and the light efficiency. Further, the productivity can be improved by aligning the reflective members on the board in the form of an array.

When it is described in the embodiment that a layer (film), a region, a pattern, or structures are formed "on" or "under" aboard, another layer (film), another region, or another pattern, it means that they are "directly" or "indirectly" formed "on" or "under" the board, another layer, another region, or another pattern.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a board comprising lead frames and a recess;
a light emitting diode (LED) chip electrically connected to the lead frames; and
a reflective member disposed on the board and surrounding the LED chip so as to reflect light emitted from the LED chip, the reflective member comprising a frame having an opening passing through a top surface of the frame and a bottom surface of the frame, and a plurality of protrusions protruded down with reference to a top surface of the board for coupling the reflective member to the board,
wherein the frame and the protrusion are formed of a same material so as to form a unitary body, and
wherein the plurality of protrusions protrude through corresponding through holes in the board with thermally compressed end portions coupling the reflective member to the board.

2. The light emitting device of claim 1, wherein the LED chip comprises at least one of a color LED chip and a UV LED chip.

3. The light emitting device of claim 1, wherein a light transmitting resin material or a light transmitting resin material comprising a fluorescent material is in the reflective member.

4. The light emitting device of claim 1, wherein the recess of the board is passing through the top surface and the bottom surface of the board.

5. The light emitting device of claim 4,
wherein the protrusions protrude downward from a bottom surface of the frame of the reflective member, and pass through the top surface and the bottom surface of the board.

6. The light emitting device of claim 4,
wherein the frame of the reflective member comprises a sidewall frame surrounding the LED chip, and a base frame extended from a lower portion of the sidewall frame in a direction parallel to the top surface of the board, and
wherein the base frame has a top surface that is substantially perpendicular to an outer side surface of the sidewall frame.

7. The light emitting device of claim 6, wherein the sidewall frame has one of a cylindrical shape and a polyhedral shape.

8. The light emitting device of claim 1, wherein an inner surface of the fame is inclined about an axis which is perpendicular to the board.

9. The light emitting device of claim 1, wherein the board comprises one of a metal printed circuit board (PCB), a flexible PCB, a CEM PCB, an FR PCB, and a heat slug type PCB.

10. The light emitting device of claim 1, further comprising:
a lens on the reflective member.

* * * * *